United States Patent [19]

Fujii et al.

[11] Patent Number: 5,184,199
[45] Date of Patent: Feb. 2, 1993

[54] SILICON CARBIDE SEMICONDUCTOR DEVICE

[75] Inventors: Yoshihisa Fujii; Akira Suzuki, both of Nara; Katsuki Furukawa, Sakai; Mitsuhiro Shigeta, Kyoto, all of Japan

[73] Assignee: Sharp Kabushiki Kaisha, Osaka, Japan

[21] Appl. No.: 533,573

[22] Filed: Jun. 5, 1990

[30] Foreign Application Priority Data

Jun. 7, 1989 [JP] Japan .................. 1-145617

[51] Int. Cl.$^5$ ............ H01L 29/10; H01L 29/78; H01L 27/01; H01L 27/04
[52] U.S. Cl. .......................... 257/77; 257/76; 257/200; 257/289
[58] Field of Search ............ 357/80, 81, 75, 14, 357/23.1, 23.4, 23.6, 23.7, 23.15, 17, 86, 15, 46, 48, 49

[56] References Cited

U.S. PATENT DOCUMENTS

| | | | |
|---|---|---|---|
| 3,609,471 | 9/1971 | Scace et al. | 357/81 |
| 3,716,759 | 2/1973 | Scace et al. | 357/80 |
| 4,470,059 | 9/1984 | Nishizawa et al. | 357/23.4 |
| 4,796,077 | 1/1989 | Takeda et al. | 357/81 |
| 4,875,083 | 10/1989 | Palmour | 357/14 |
| 4,878,106 | 10/1989 | Sachs | 357/75 |

FOREIGN PATENT DOCUMENTS 59-20379  11/1984  Japan.
0291494  12/1986  Japan.

OTHER PUBLICATIONS

J. W. Palmour et al., J. Appl. Phys., vol. 64, No. 4, Aug. 15, 1988, pp. 2168-2177.

Primary Examiner—Andrew J. James
Assistant Examiner—Carl Whitehead, Jr.
Attorney, Agent, or Firm—David G. Conlin; Robert F. O'Connell

[57] ABSTRACT

A silicon carbide semiconductor device is disclosed which includes a semiconductor substrate and a silicon carbide single-crystal layer formed above the substrate, the silicon carbide single-crystal layer having a device active region. The silicon carbide semiconductor device further includes an aluminum nitride single-crystal layer which is disposed between the silicon carbide single-crystal layer and the substrate. The aluminum nitride single-crystal layer functions as an electrically insulating layer by which the silicon carbide signale-crystal layer is isolated electrically from the substrate.

7 Claims, 3 Drawing Sheets

SILICON CARBIDE SEMICONDUCTOR DEVICE

BACKGROUND OF THE INVENTION

1. Field of the Invention

This invention relates to a silicon carbide semiconductor device and more particularly to a silicon carbide semiconductor device having an aluminum nitride single-crystal layer as an electrically insulating layer.

2. Description of the Prior Art

Silicon carbide (SiC) is a semiconductor material with a wide band gap of 2.3 to 3.3 electronvolts (eV), which is thermally, chemically and mechanically quite stable, and also has a great resistance to radiation damage. Furthermore, the saturation drift velocity of electrons in silicon carbide is greater than that in silicon (Si) and other semiconductor materials. The use of semiconductor devices made of conventional semiconductor materials such as silicon is difficult under severe conditions of high temperature, high output drive, high frequency operation, and radiation exposure. Therefore, semiconductor devices using silicon carbide are expected to have wide applications for devices which can be used under such conditions without degrading their characteristics.

Despite these many advantages and capabilities, a silicon carbide semiconductor device has not yet been put into actual use, because a technique still remains to be established for growing high quality silicon carbide single crystals having a large surface area with good reproducibility which is required for the commercial production thereof.

In recent years, there has been developed a process for growing large-sized high-quality single crystals of silicon carbide on a single-crystal substrate of silicon by the chemical vapor deposition (CVD) technique (e.g., Japanese Laid-Open Patent Publication No. 59-203799). This technique makes it possible to control the conductivity type, the impurity concentration, or the like of silicon carbide single crystals obtained by adding an appropriate amount of impurities during the growth of the single crystals. Therefore, this technique makes many contributions to the development of various semiconductor devices in which silicon carbide single crystals are used.

In conventional silicon carbide semiconductor devices, a device active region is formed in a silicon carbide single-crystal layer grown directly on a silicon single-crystal substrate.

However, the lattice constant of silicon single crystals is different from that of silicon carbide single crystals by as much as about 20%, so that there are many crystal defects due to the lattice mismatching (e.g., stacking faults) within the silicon carbide single-crystal layer grown on the silicon single-crystal substrate. These crystal defects cause the generation of leakage current in the silicon carbide semiconductor device. The leakage current flows in the silicon carbide single-crystal layer, the interface between the silicon single-crystal substrate and the silicon carbide single-crystal layer, and the silicon single-crystal substrate via the crystal defects. The generation of leakage current degrades the characteristics of semiconductor devices.

Therefore, silicon carbide semiconductor devices with the above-mentioned structure, which have been developed recently, do not have satisfactory device characteristics and cannot be used for practical applications.

SUMMARY OF THE INVENTION

The silicon carbide semiconductor device of this invention, which overcomes the above-discussed and numerous other disadvantages and deficiencies of the prior art, comprises a semiconductor substrate and a silicon carbide single-crystal layer formed above the substrate, the silicon carbide single-crystal layer having a device active region, wherein an aluminum nitride single-crystal layer functioning as an electrically insulating layer is disposed between the silicon carbide single-crystal layer and the substrate.

In one embodiment, a metal-oxide-semiconductor structure for field-effect transistors is fabricated in the device active region of the silicon carbide single-crystal layer.

In one preferred embodiment, the above-mentioned field-effect transistor is in an inversion mode.

In one preferred embodiment, the above-mentioned field-effect transistor is in a depletion mode.

Thus, the invention described herein makes possible the objectives of (1) providing a silicon carbide semiconductor device (e.g., metal-oxide-semiconductor field-effect transistor, MOSFET) in which a silicon carbide single-crystal layer having an active region is formed on an aluminum nitride single-crystal layer, so that leakage current can significantly be reduced, resulting in quite excellent device characteristics; (2) providing a silicon carbide semiconductor device which can be used under severe conditions of high temperature, high output drive, high frequency operation, and radiation exposure, where difficulties are encountered with devices made of conventional semiconductor materials, particularly silicon; and (3) providing a silicon carbide semiconductor device which can be produced by the use of a silicon substrate in the same manner as that of conventional silicon semiconductor devices and in which an aluminum nitride single-crystal layer can be formed by the conventional chemical vapor deposition (CVD) technique, thereby attaining mass production of the device on a commercial scale with conventional manufacturing processes.

BRIEF DESCRIPTION OF THE DRAWINGS

This invention may be better understood and its numerous objects and advantages will become apparent to those skilled in the art by reference to the accompanying drawings as follows:

FIGS. 1b–1e are sectional views showing the production of the MOSFET of FIG. 1a.

FIG. 2 is a graph showing the drain current-voltage characteristics of the MOSFET of FIG. 1a.

DETAILED DESCRIPTION OF THE INVENTION

Silicon carbide has various crystal structures (i.e., polytype or polymorphism), which are classified into two large types, α-type and β-type. α-type silicon carbide has a hexagonal or rhombohedral crystal structure having a band gap of 2.9 to 3.3 eV, whereas β-type silicon carbide has a cubic zinc-blende structure having a band gap of 2.2 eV, which is the narrowest band gap of all the crystal structures of silicon carbide. On the other hand aluminum nitride (AlN) has a hexagonal wurtzite structure having a band gap of 6.2 eV, which is relatively wider than that of silicon carbide.

In general, comparing the [111] direction of a zinc-blende structure to the c-axis direction of a wurtzite structure, a set of tetrahedral covalent bonds in the wurtzite structure is nearly equal to that of the zinc-blende structure, except that the set of tetrahedral covalent bonds in every other layer of the wurtzite structure is rotated through an angle of 180° around the bond parallel to the [111]-axis direction.

Therefore, when β-type silicon carbide single crystal is grown on an aluminum nitride single-crystal layer, not only the distortion of crystal structure at the interface therebetween but also the generation of crystal defects in the silicon carbide single-crystal layer can be reduced because of some similarities between the two crystal structures and their relatively close lattice constants. Moreover, aluminum nitride has a band gap significantly wider than that of silicon carbide. When the aluminum nitride single-crystal layer is used as an electrically insulating layer, the silicon carbide single-crystal layer can sufficiently be isolated from the semiconductor substrate.

For these reasons, the silicon carbide semiconductor device of the present invention can attain the excellent advantages of having significantly reduced leakage current and exhibiting satisfactory device characteristics.

DESCRIPTION OF THE PREFERRED EMBODIMENTS

The invention will be further explained by reference to the following examples.

EXAMPLE 1

This example will describe an inversion-mode n-channel MOS field-effect transistor fabricated on a high-resistive β-SiC single-crystal layer. The field-effect transistor was produced as follows.

Figure 1A:
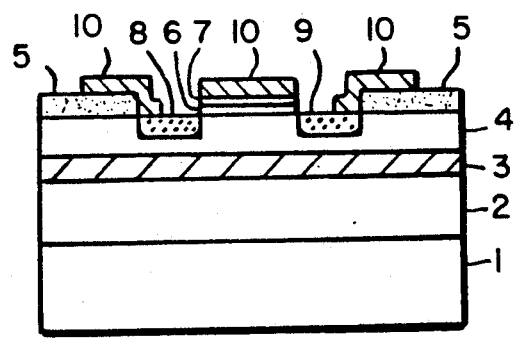
FIG. 1a is a sectional view showing an inversion-mode n-channel metal-oxide-semiconductor field-effect transistor (MOSFET) which is a silicon carbide semiconductor device of this invention.
Figure 1B:
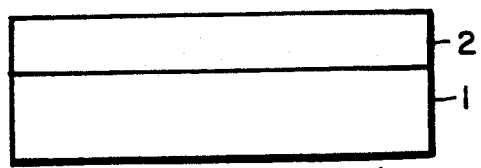
Figure 1C:
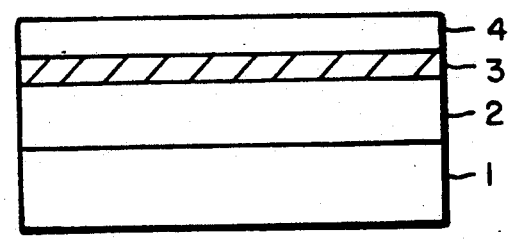

First, as shown in FIG. 1b, on the (111) plane of an Si single-crystal substrate 1, a β-SiC single-crystal layer 2 (the thickness thereof being about 5 μm) was grown by the chemical vapor deposition (CVD) technique. The source gases were silane (SiH$_4$) and propane (C$_3$H$_8$). Then, as shown in FIG. 1c, on the β-SiC single-crystal layer 2, an aluminum nitride (AlN) single-crystal layer 3 (the thickness thereof being about 2 μm) was grown as an electrically insulating layer by the CVD technique. The source gases used were trimethylaluminum (TMA) and ammonia (NH$_3$). The temperature of the substrate during growth was 1300° C.

Next, as shown in FIG. 1c, on the AlN single-crystal layer 3, a boron-doped high-resistive β-SiC single-crystal layer 4 (the thickness thereof being about 3 μm) was formed by the CVD technique. The source gases used were silane (SiH$_4$) and propane (C$_3$H$_8$). As an impurity gas, diborane (B$_2$H$_6$) was used, and by introducing a prescribed amount of B$_2$H$_6$ gas in the reaction tube while the SiC single-crystal was being grown, a β-SiC single-crystal layer 4 with a high resistivity of about 5000 ohm-cm was obtained.

Figure 1D:
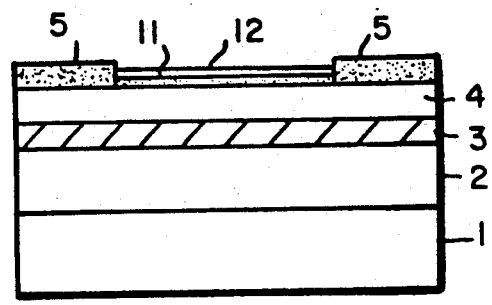

Thereafter, on the high-resistive β-SiC single-crystal layer 4, a silicon oxide (SiO$_2$) film was formed by the CVD technique. For the growth of the SiO$_2$ film, the plasma chemical vapor deposition technique may also be used. Then, with the use of photolithography, the portion of the SiO$_2$ film corresponding to an active region was removed by an etching technique to form an field insulating film 5 as shown in FIG. 1d. As an etchant for the etching of the SiO$_2$ film, a solution of hydrogen fluoride (HF) was used. Next, on the high-resistive β-SiC single-crystal layer 4, a thermal oxide film 11 (the thickness thereof being about 50 nm) was formed by thermal oxidation in an atmosphere of oxygen at 1100° C. for 3 hours. Then, as shown in FIG. 1d, on the thermal oxide film 11, a phosphorus-doped Si polycrystalline layer 12 (the thickness thereof being about 500 nm) was formed by chemical vapor deposition.

Figure 1E:
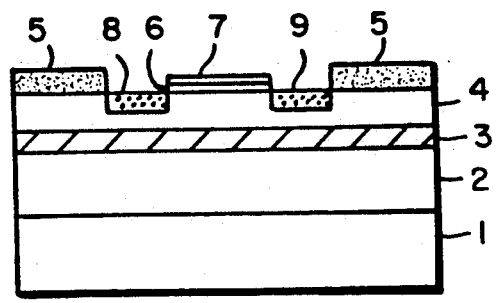

Next, as shown in FIG. 1e, with the use of photolithography, the portions of the thermal oxide film 11 and Si polycrystalline film 12 corresponding to the source and drain regions were removed by an etching technique to form a gate insulator film 6 and a gate electrode 7. Then, nitrogen ions were implanted in the high-resistive β-SiC single-crystal layer 4 to form an n-type source region 8 and drain region 9 as shown in FIG. 1e. The accelerating voltage was 160 keV and the dose of nitrogen ions implanted was $3 \times 10^{14}$ cm$^{-2}$. After ion implantation, the nitrogen ion-implanted source region 8 and drain region 9 were made low resistive by a thermal anneal treatment in an atmosphere of argon at about 1100° C. for 30 minutes. Finally, a wiring electrode 10 was formed by deposition of aluminum on the gate electrode 7, source region 8, and drain region 9, resulting in an inversion-mode n-channel MOS field-effect transistor fabricated on a high-resistive β-SiC single-crystal layer as shown in FIG. 1a.

For the purpose of comparison, a conventional inversion-mode n-channel MOS field-effect transistor was produced in the same way as described above, except that a high-resistive β-SiC single-crystal layer having an active region was directly grown on the Si single-crystal substrate without disposing the AlN single-crystal layer therebetween.

Figure 2:
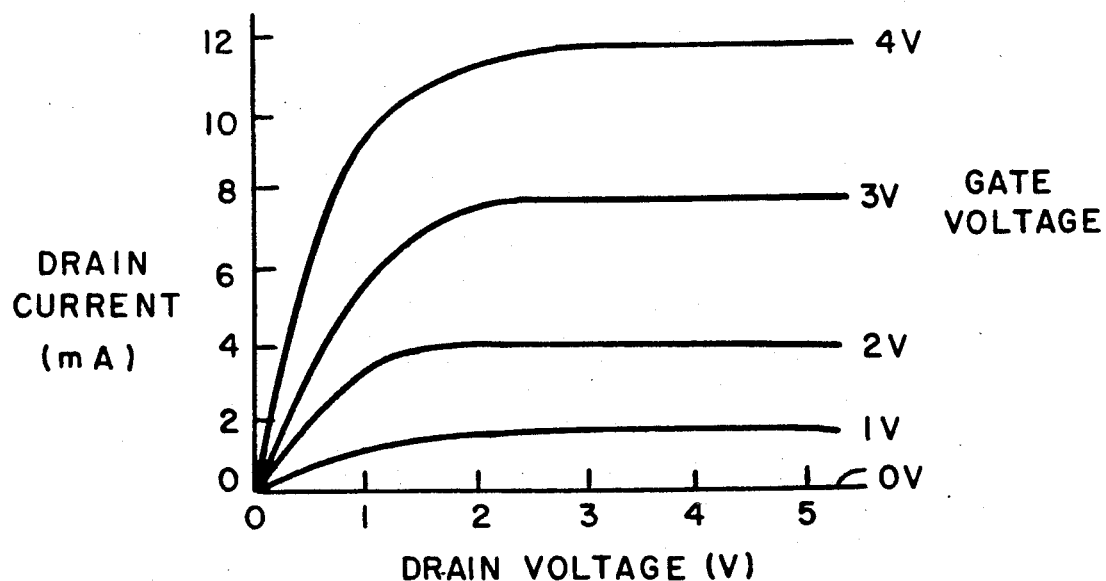
Figure 3:
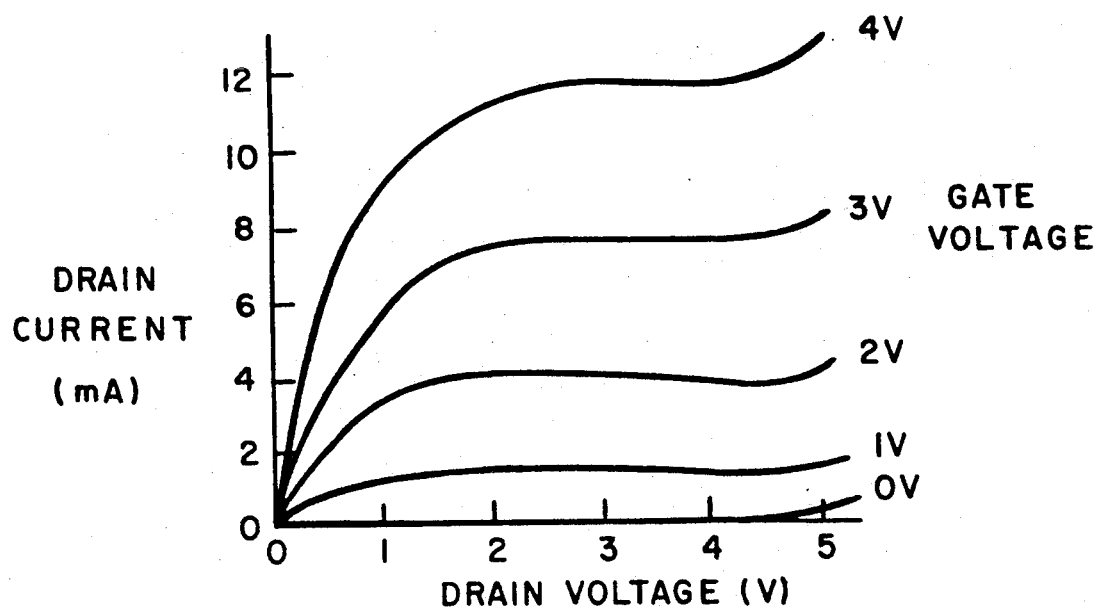
FIG. 3 is a graph showing the drain current-voltage characteristics of a conventional inversion-mode n-channel MOSFET fabricated on silicon carbide single-crystal layers.

The transistor characteristics (drain current-voltage characteristics) of the MOSFETs thus obtained, that is, the MOSFET of this example and the conventional MOSFET, were measured. The results are shown in FIGS. 2 and 3. As can be seen from these figures, the MOSFET of this example (FIG. 2) showed excellent drain-current saturation and significantly reduced leakage current as compared with the conventional MOSFET (FIG. 3), because the high-resistive β-SiC single-crystal layer 4 having a device active region was formed on the AlN single-crystal layer 3 functioning as an electrically insulating layer. For example, the leakage current in the off state (at a gate voltage of 0 V) to a drain voltage of 5 V was 5 A with respect to the conventional MOSFET, whereas the leakage current of the MOSFET of this example under the same condition was only 3 nA.

EXAMPLE 2

This example will describe a depletion-mode n-channel MOSFET fabricated on an n-type β-SiC single-crystal layer. This MOSFET was produced in the same way as in Example 1, except that a nitrogen-doped n-type β-SiC single-crystal layer (the thickness thereof being about 0.5 μm) was used in place of the boron-doped high-resistive β-SiC single-crystal layer (the thickness thereof being about 3 μm). The MOSFET of this example is of the normally-on type in which the n-type β-SiC single-crystal layer functions as a channel layer and a depletion layer expanded in the channel layer by application of a gate voltage thereto is utilized to control the current flowing through the channel layer. The n-type β-SiC single-crystal layer was formed by adding a prescribed amount of nitrogen ($N_2$) to the source gases while the β-SiC single crystal was being grown. The carrier concentration of the n-type β-SiC single-crystal layer was $5 \times 10^{15}$ cm$^{-3}$.

For the purpose of comparison, a conventional MOSFET of the normally-on type was produced in the same way as described above, except that an n-type SiC single-crystal layer having a device active region was formed on a p-type SiC single-crystal layer which had been grown on an Si single-crystal substrate in place of the AlN single-crystal layer.

Figure 4:
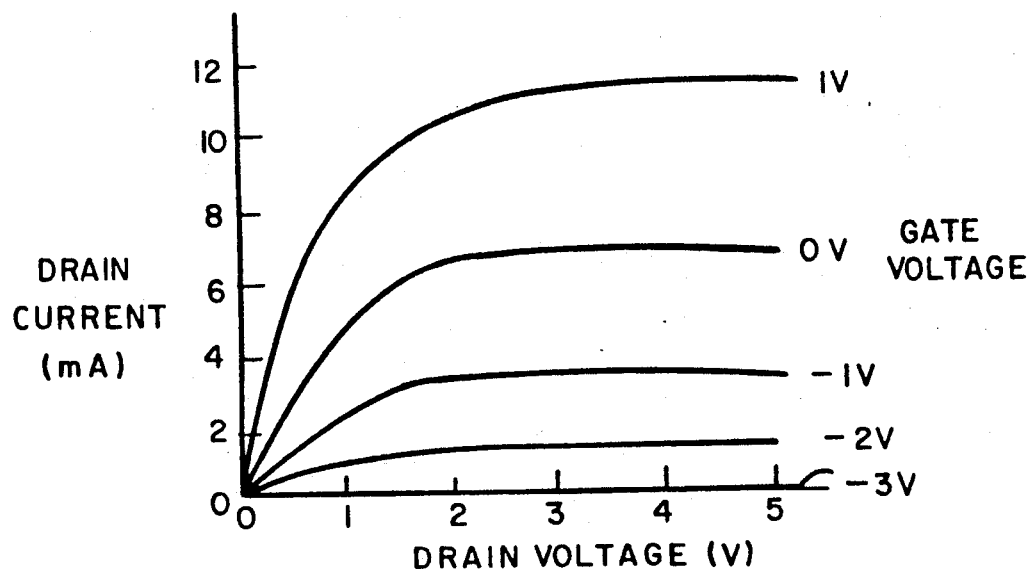
FIG. 4 is a graph showing the drain current-voltage characteristics of a depletion-mode n-channel MOSFET which is another silicon carbide semiconductor device.
Figure 5:
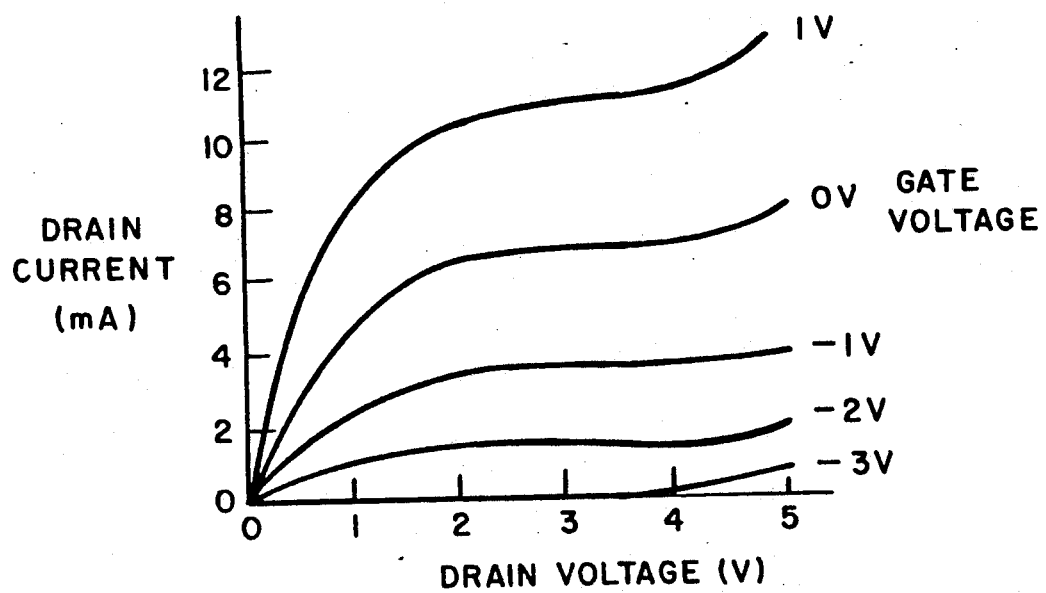
FIG. 5 is a graph showing the drain current-voltage characteristics of a conventional depletion-mode n- channel MOSFET fabricated on silicon carbide single-crystal layers.

The transistor characteristics (drain current-voltage characteristics) of the MOSFETs thus obtained, that is, the MOSFET of this example and the conventional MOSFET, were measured. The results are shown in FIGS. 4 and 5. As can be seen from these figures, the MOSFET of this example (FIG. 4) showed excellent drain-current saturation and significantly reduced leakage current as compared with the conventional MOSFET (FIG. 5), because the n-type β-SiC single-crystal layer having a device active layer was formed on the AlN single-crystal layer functioning as an electrically insulating layer. For example, the leakage current of the conventional MOSFET in the off state (at a gate voltage of −3 V) to a drain voltage of 5 V was 10 μA, whereas the leakage current of the MOSFET of this example under the same condition was only 15 pA.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims can be construed as encompassing all the features of patentable novelty that reside in the present invention, including all features that would be treated as equivalents thereof by those skilled in the art to which this invention pertains.

What is claimed is:

1. A silicon carbide semiconductor device comprising a semiconductor substrate and a silicon carbide single-crystal layer formed above said substrate, said silicon carbide single-crystal layer having a device active region, wherein an aluminum nitride single-crystal layer functioning as an electrically insulating layer is disposed between the silicon carbide single-crystal layer and the substrate.

2. A silicon carbide semiconductor device according to claim 1, wherein a metal-oxide-semiconductor structure for field-effect transistors is fabricated in the device active region of said silicon carbide single-crystal layer.

3. A silicon carbide semiconductor device according to claim 2, wherein said field-effect transistor is in an inversion mode.

4. A silicon carbide semiconductor device according to claim 2, wherein said field-effect transistor is in a depletion mode.

5. A silicon carbide semiconductor device comprising:
   a semiconductor substrate;
   a first silicon carbide single-crystal layer formed on said semiconductor substrate;
   an aluminum nitride single-crystal layer functioning as an electrically insulating layer is disposed on the first silicon carbide single-crystal layer; and
   a second silicon carbide single-crystal layer formed on said aluminum nitride single-crystal layer, said second silicon carbide single-crystal layer having a device active region.

6. A silicon carbide semiconductor device according to claim 5, wherein said second silicon carbide single-crystal layer has the same crystal structure as that of said first silicon carbide single-crystal layer.

7. A silicon carbide semiconductor device according to claim 6, wherein said second silicon carbide single-crystal layer is a β-silicon carbide layer.

* * * * *